United States Patent
Ueshima

(10) Patent No.: US 9,185,812 B2
(45) Date of Patent: Nov. 10, 2015

(54) LEAD-FREE SOLDER PASTE

(75) Inventor: Minoru Ueshima, Matsudo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 1964 days.

(21) Appl. No.: 11/920,962

(22) PCT Filed: May 24, 2006

(86) PCT No.: PCT/JP2006/310307
§ 371 (c)(1),
(2), (4) Date: Mar. 19, 2009

(87) PCT Pub. No.: WO2006/126564
PCT Pub. Date: Nov. 30, 2006

(65) Prior Publication Data
US 2009/0301606 A1    Dec. 10, 2009

(30) Foreign Application Priority Data
May 25, 2005    (JP) .................... 2005-151805

(51) Int. Cl.
*B23K 35/26*    (2006.01)
*B23K 35/22*    (2006.01)
*B23K 35/00*    (2006.01)
(Continued)

(52) U.S. Cl.
CPC ............ *H05K 3/3484* (2013.01); *B23K 35/025* (2013.01); *B23K 35/0244* (2013.01); *B23K 35/22* (2013.01); *B23K 35/262* (2013.01); *B23K 35/362* (2013.01); *H05K 2201/0215* (2013.01); *H05K 2201/0257* (2013.01)

(58) Field of Classification Search
None
See application file for complete search history.

(56) References Cited

U.S. PATENT DOCUMENTS

| | | | |
|---|---|---|---|
| 2002/0102432 | A1 | 8/2002 | Ochiai et al. .................. 428/671 |
| 2003/0168130 | A1* | 9/2003 | Shohji ........................... 148/403 |
| 2006/0196579 | A1* | 9/2006 | Skipor et al. .................... 148/24 |

FOREIGN PATENT DOCUMENTS

| | | | | |
|---|---|---|---|---|
| CN | 1389326 | * | 1/2003 | ............ B23K 35/24 |
| JP | 09253882 | | 9/1997 | |

(Continued)

OTHER PUBLICATIONS

Metal Powder Industries Federation (http://www.mpif.org/designcenter/faq.asp).*

(Continued)

*Primary Examiner* — Yoshitoshi Takeuchi
(74) *Attorney, Agent, or Firm* — Michael Tobias

(57) ABSTRACT

In a conventional Sn—Zn based lead-free solder, Zn crystallized to a large size of several tens of micrometers, and it was difficult to suppress the formation of coarse crystallizates and to increase the bonding strength without changing the soldering temperature. There were alloys which improved strength by the addition of a minute amount of a Group 1B metal, but the alloys had an increased melting temperature so that reflow could not be performed with the same temperature profile as for Sn—Pb, so the alloys had advantages and disadvantages. By using a solder paste formed by mixing an ethanol solution containing nanoparticles having a particle diameter of 5-300 nm and containing at least one of Ag, Au, and Cu with a flux and solder powder for an Sn—Zn based lead-free solder paste, the formation of an alloy of Au, Au, or Cu with Zn occurs during soldering, thereby forming fine clusters in the resulting liquid phase of molten solder, and a fine solder structure is obtained following melting.

6 Claims, 1 Drawing Sheet

(51) Int. Cl.
*H05K 3/34* (2006.01)
*B23K 35/02* (2006.01)
*B23K 35/362* (2006.01)

(56) References Cited

FOREIGN PATENT DOCUMENTS

| | | |
|---|---|---|
| JP | 2002224880 | 8/2002 |
| JP | 2003062687 | 3/2003 |
| JP | 2003112285 | 4/2003 |
| JP | 2004148372 | 5/2004 |
| JP | 2004268065 | 9/2004 |
| WO | 2004089573 | 10/2004 |
| WO | WO 2006/063134 * 6/2006 | ............... C22C 1/02 |

OTHER PUBLICATIONS

English translation of CN1389326 (2003).*

* cited by examiner

LEAD-FREE SOLDER PASTE

TECHNICAL FIELD

This invention relates to a solder paste and particularly an Sn—Zn based lead-free solder paste for use in soldering of electronic equipment.

BACKGROUND ART

Methods of soldering electronic parts include the soldering iron method, the flow soldering method, the reflow soldering method, and the like.

The reflow soldering method is a method in which a solder paste comprising a solder powder and a flux is applied by printing or dispensing only to necessary locations of a printed circuit board, on which electronic parts are then placed, and the solder paste is melted by a heating apparatus such as a reflow furnace to solder the electronic parts to the printed circuit board. The reflow soldering method can perform soldering with excellent productivity and reliability in that not only can a large number of locations be soldered in a single operation but also in that there is no occurrence of bridge formation even in an electronic part having a narrow pitch and solder does not adhere to unneeded locations.

Solder paste conventionally employed in the reflow method uses a Pb—Sn alloy to form a solder powder. The Pb—Sn alloy is advantageous in that its melting point is 183° C. for a eutectic composition (Pb-63Sn), so it has little thermal effect on electronic parts which have poor resistance to heat, and in that it has excellent solderability, so there is little occurrence of soldering defects such as unsoldered portions or dewetting. When electronic equipment which is soldered with a solder paste using this Pb—Sn alloy becomes old or malfunctions, instead of being upgraded or repaired, it has been discarded. When printed circuit boards are discarded, they have been disposed of by burial rather than incineration. This is because solder is metallically adhered to copper foil conductor of printed circuit boards and the copper foil and the solder cannot be separated for reuse. When acid rain contacts printed circuit boards which have been disposed of by burial, Pb in the solder leaches out and pollutes underground water. If underground water containing Pb is drunk for long periods by humans or livestock, there is a concern of the occurrence of Pb poisoning. Therefore, there has come to be a strong demand in the electronics equipment industry for so-called "lead-free solder" which does not contain Pb.

Lead-free solders have Sn as a main constituent element. Presently-used lead-free solders are binary alloys such as Sn-3.5Ag (melting point: 221° C.), Sn-0.7Cu (melting point: 227° C.), Sn-9Zn (melting point: 199° C.), and Sn-58Bi (melting point: 139° C.), as well as these solders to which an additional element such as Ag, Cu, Zn, Bi, In, Sb, Ni, Cr, Co, Fe, Mn, P, Ge, or Ga is suitably added. In the present invention, "based alloy" means to include the alloy itself as well as alloys in which at least one additional element is added to the binary alloy. For example, an Sn—Zn based alloy includes an Sn—Zn alloy and alloys in which at least one additional element is added to Sn—Zn, and an Sn—Ag based alloy includes an Sn—Ag alloy as well as alloys in which at least one additional element is added to Sn—Ag.

The Sn—Ag based, Sn—Cu based, and Sn—Ag—Cu based lead-free solders which are mainly used at present have a melting point of at least 220° C. Therefore, when they are formed into a solder paste and used in the reflow method, the peak temperature at the time of reflow ends up being at least 250° C., and they had the problem that electronic parts or printed circuit boards underwent thermal damage during reflow heating.

An Sn—Zn based lead-free solder has a melting point close to that of a conventional Pb—Sn eutectic solder. For example, an Sn-9Zn eutectic lead-free solder has a melting point of 199° C. Therefore, this type of solder makes it possible to use the reflow profile for a conventional Pb—Sn eutectic solder as it is. As a result, the thermal effect on electronic parts or printed circuit boards is minimized. However, an Sn-9Zn eutectic solder paste has poor wettability, so an Sn-8Zn-3Bi lead-free solder which contains Bi added to an Sn—Zn alloy having a nearly eutectic composition is frequently used. Sn—Zn based lead-free solders have superior properties compared to other lead-free solders in that they have a melting point close to that of conventional Sn—Pb solders. In addition, Zn contained therein is an essential elements for humans, so compared to other lead-free solders, they are not harmful to the human body, and there are large reserves of Zn compared to In, Ag, Bi, and the like, so its unit cost is low. Accordingly, in spite of the fact that their solderability is not so good, Sn—Zn based lead-free solders are used as solders for solder paste, and in particular, they are used for printed circuit boards for which Sn—Ag based lead-free solder cannot be used because the parts do not have sufficient heat resistance.

However, Sn—Zn based lead-free solders have the problem that after soldering of a printed circuit board having Cu lands such as commonly used FR-4 printed circuit boards, the strength of the resulting soldered joint decreases if the printed circuit board is left at a high temperature. This is because reactivity between Zn and Cu is high. Therefore, when an Sn—Zn based lead-free solder is used for soldering of a printed circuit board with Cu lands, if a high temperature state continues for a long period, the Zn in the solder migrates through the solder alloy layer and enters into the Cu lands, and a large number of voids called Kirkendall voids develop between the resulting intermetallic compounds and the solder. These voids decrease the bonding is strength of solder and worsen the reliability of soldering. Therefore, Au plating is necessary when using an Sn—Zn based lead-free solder, resulting in the problem of an increase in the manufacturing costs of electronic equipment.

One parameter causing a decrease in bonding strength when soldering Cu lands of a printed circuit board using an Sn—Zn based lead-free solder is humidity. If humidity is high, Zn is readily oxidized into $Zn^{2+}$ ions, thus causing Zn in an Sn—Zn based lead-free solder to readily migrate through the solder alloy layer and enter into Cu and leading to the formation of a large number of voids. This phenomenon becomes marked when the humidity is at least 80% even when the temperature is 100° C. or below. Voids also easily develop in conditions where moisture condensation occurs, thereby causing a decrease in the bonding strength of solder.

Means which have been disclosed for increasing the bonding strength of these Sn—Zn based lead-free solders include a solder paste comprising an Sn—Zn based lead-free solder mixed with a flux in which a metal powder containing a Group 1B metal as a constituent element is dispersed (JP 2002-224880 A1) and a lead-free solder alloy having Ag added to an Sn—Zn based lead-free solder (JP H09-253882 A1).

Solder alloys containing nanoparticles have been proposed in the art. Nanoparticles are powder having a particle diameter on the nanometer order. They can enter the spaces between particles of usual solder powder having a particle diameter on the micrometer order and exhibit various properties. Examples of technology using nanoparticles which have been disclosed include a solder having increased resistance to fracture by disposing Ni nanoparticles on the surface of spherical particles of solder (JP 2003-062687 A1) and a solder alloy of an Sn—Zn based lead-free solder in the form of a self-organized nanoparticles (JP 2004-268065 A1).

Patent Document 1: JP 2002-224880 A1
Patent Document 2: JP H09-253882 A1
Patent Document 3: JP 2003-062687 A1
Patent Document 4: JP 2004-268065 A1

DISCLOSURE OF INVENTION

As stated above, when a soldered joint between an Sn—Zn based lead-free solder alloy and Cu was exposed to a high temperature and high humidity environment, there was the problem that the joint strength of the solder significantly decreased. Therefore, a printed circuit board having Cu lands such as typically used FR-4 printed circuit boards could not be used with this joint, and an expensive printed circuit board having Au plating was necessary, resulting in an increase in manufacturing costs. Accordingly, there is a demand for an Sn—Zn based lead-free solder alloy having excellent heat resistance and moisture resistance.

However, in the prior art of Patent Document 1 which is a solder paste comprising metal powder containing a Group 1B metal as a constituent element dispersed in a flux which is mixed with an Sn—Zn based lead-free solder, as can be seen from Table 3 of Patent Document 1, the amount of powder of Group 1B metal which is added to an Sn—Zn lead-free solder powder is at least 10% with respect to the Sn—Zn based lead-free solder powder. Therefore, unless the peak temperature of reflow is increased, the solder does not melt, and the advantage of an Sn—Zn based lead-free solder that reflow is possible with substantially the same temperature profile as a conventional Sn—Pb solder can no longer be achieved. Furthermore, if a Group 1B metal powder is used in unalloyed form, the metal powder does not melt under a typical reflow profile, and the powder remains as particles in the solder after melting. The Group 1B metal particles remaining in the solder increase the bonding strength at room temperature, but in an environment in which solder is repeatedly exposed to a cycle of a high temperature and a low temperature, due to the difference between the strength of an Sn—Zn based lead-free solder after melting and that of the Group 1B metal particles in the solder, metal fatigue occurs inside the solder and causes a decrease in the strength of the solder.

As described in Patent Document 2, addition of Ag to an Sn—Zn based lead-free solder results in an increased bonding strength of the Sn—Zn based lead-free solder alloy. In order to further increase the strength, it is necessary to add a large amount of Ag. However, if a large amount of Ag is added to an Sn—Zn lead-free solder, the liquidus temperature of the solder ends up increasing, and the advantage of an Sn—Zn based lead-free solder alloy that it can be used on parts having poor heat resistance can no longer be realized.

The present inventors discovered that the presence of nanoparticles containing at least one of Ag, Au, and Cu and having a particle diameter of 5-300 nanometers on the surface of an Sn—Zn based lead-fee solder powder results in refinement of the structure of the solder alloy after solidification and thus forms a soldered joint which does not decrease in bonding strength after melting even when exposed to a high temperature, high humidity environment, and they thereby completed the present invention.

The present inventors also found that by dispersing nanoparticles containing at least one of Ag, Au, and Cu and having a particle diameter of 5-300 nm in a flux, when performing mounting of parts by soldering using the flux, the solder and the nanoparticles work together, thereby refining the structure of the soldered portion and resulting in the formation of a soldered joint having a high bonding strength after mounting, and they completed the present invention.

The present inventors studied the cause of a decrease in the strength of soldered portions formed on Cu by soldering with an Sn—Zn lead-free solder. They found that the cause is that a Cu—Zn alloy layer which is susceptible to oxidation is formed in the interface between the copper and the solder. When Cu is soldered with a conventional Sn—Pb solder, Sn—Ag based lead-free solder, or Sn—Bi based lead-free solder, the Sn in the solder alloy reacts with Cu to form an Sn—Cu alloy layer. In contrast, when Cu is soldered with an Sn—Zn based lead-free solder, a Cu—Zn alloy layer is formed. A Cu—Zn alloy layer is present not only in the interior of a fillet formed by the solder but also extends to the exterior of the base of the fillet. If moisture contacts the solder, the moisture forms an electrolytic solution, which selectively oxidizes the Zn in the solder into ions. The oxidized Zn ions migrate into the Cu—Zn alloy layer to form a Cu—Zn alloy, and the Zn ions pass through the alloy to layer and penetrate into the Cu portion. In the Sn—Zn based lead-free solder after Zn ions have migrated in this manner, voids develops by consumption of Zn. The voids which develop in the interface of the Cu—Zn alloy layer gradually advance along the interface, resulting in a decrease in the strength of soldered portion. Eventually, peeling occurs in the joint interface.

The present inventors studied the relationship between the strength and structure of solder. They found that a crystallizate of an $Ag_3Sn$ intermetallic compound in the case of an Sn—Ag—Cu based alloy or a crystallizate of Zn in the case of an Sn—Zn based alloy is dispersed in the alloy structure and increases the strength of the alloy. It is known that such a crystallizate can be refined by increasing the cooling rate or adding a minute substance serving as crystallization nuclei. However, it is difficult to control the cooling rate in soldering, and rapid cooling causes residual stresses to increase and hence is not desirable. Some substances are empirically known to serve as crystallization nuclei, but substances which serve as crystallization nuclei of $Ag_3Sn$ or Zn have not yet been found. Thus, it is extremely difficult to refine the alloy structure in a process which cannot control the cooling rate, and doing so is impossible from a practical standpoint.

A method capable of increasing the bonding strength of an Sn—Ag—Cu based alloy or an Sn—Zn—Bi based alloy which has been studied involves the addition of Bi or Sb which dissolves in the Sn matrix of the alloy. However, excessive addition of Bi causes a decrease in the solidus temperature of solder, and this leads to lift-off or causes peeling of joints when flow soldering is carried out after reflow heating. While Sb forms intermetallic compounds with Ag, Cu, and Zn and increases the strength of solder, at the same time it increases the liquidus temperature of solder, thereby worsening the workability of soldering. In view of this point and the fact that restrictions on Sb are being concerned due to its toxicity, this method cannot be said as an actual countermeasure.

As described above, the reason why the alloy structure of an Sn—Ag—Cu based lead-free solder or an Sn—Zn based lead-free solder cannot be refined is assigned to the cooling rate and the formation of nuclei for a crystallizate, which both cannot be controlled in a soldering process.

The mechanism of refinement of the solder structure which is achieved by the present invention after soldering is hypothesized by the present inventors as follows.

1. Ag, Au, and Cu nanoparticles have a particle diameter of approximately 5-300 nm. Due to the minute particle diameter, they are uniformly dispersed even in a solvent such as ethanol with little sedimentation. Thus, these nanoparticles can substantially behave as a liquid. Therefore, though they remain in a solid state at a reflow temperature which is not higher than the melting point of the nanoparticles, they do not have an adverse effect on the solderability of solder paste.

2. Ag, Au, and Cu nanoparticles having a particle diameter of 5-300 nm and substantially behaving as a liquid preferentially react with Zn in an Sn—Zn based lead-free solder powder to form nuclei of Zn—Ag, Zn—Au, and Zn—Cu intermetallic compounds, respectively. In particular, Zn forms a solid solution with Ag, Au, and Cu, and in a Zn-rich state, it is thought that theoretically a Zn phase having Ag and the like dissolved therein to form a solid solution is formed as an outermost layer of the nanoparticles. It is theoretically apparent that if minute particles which have the same composition as a substance to be crystallized are present in a liquid phase, these particles serve as nuclei for crystallization. Thus, dissolution of Au, Ag, Cu, and the like in Zn to form a solid solution is advantageous in the formation of crystallization nuclei.

3. During reflow heating, the nuclei of the intermetallic compounds which are formed partly dissolve in the liquid phase of a molten Sn—Zn based lead-free solder, but they do not completely dissolve therein and part of them is present in the liquid phase of solder as clusters of several to several hundred nanometers in size (which are formed by a reaction between the metal and an element of the solder alloy).

4. When the molten Sn—Zn based lead-free solder is cooled, the nanoclusters which have reacted with the Zn metal and are dispersed in the liquid phase of molten solder serve as crystallization nuclei, resulting in an increase in the number of crystallization sites of Zn. As a result, the size of Zn which are crystallized is refined. In a solder paste according to the present invention, a large number of nuclei of intermetallic compounds are present in the form of clusters in the molten solder. Therefore, refinement of Zn occurs not only on the outer surface but also reaches the to interior of the solder, and the structure of the entire joint is refined.

In a lead-free solder according to the present invention, Zn reacts with Ag, Au, Cu, and the like. These metals dissolve in Zn with a high solubility to form a solid solution, and in a Zn-rich state they form an alloy and do not cause a decrease in the solidus temperature of the solder. In contrast, with Ni nanoparticles as disclosed in Patent Document 3, for example, since Ni hardly dissolves in Zn, even if an Ni—Zn intermetallic compound is formed, the crystal structure of the Ni—Zn compound and Zn greatly differ from each other. Furthermore, the crystallized Zn does not serve as crystallization nuclei, so refinement of the solder structure does not take place.

In the present invention, by using a solder paste in which a dispersion in an alcoholic solvent of nanoparticles having a particle diameter of 5-300 nm and containing at least one of Ag, Au, and Cu is mixed with a flux and a solder powder, the structure of solder formed after soldering is refined, thereby making it possible to increase the bonding strength of the resulting soldered joint.

BEST MODE FOR CARRYING OUT THE INVENTION

Figure 1:
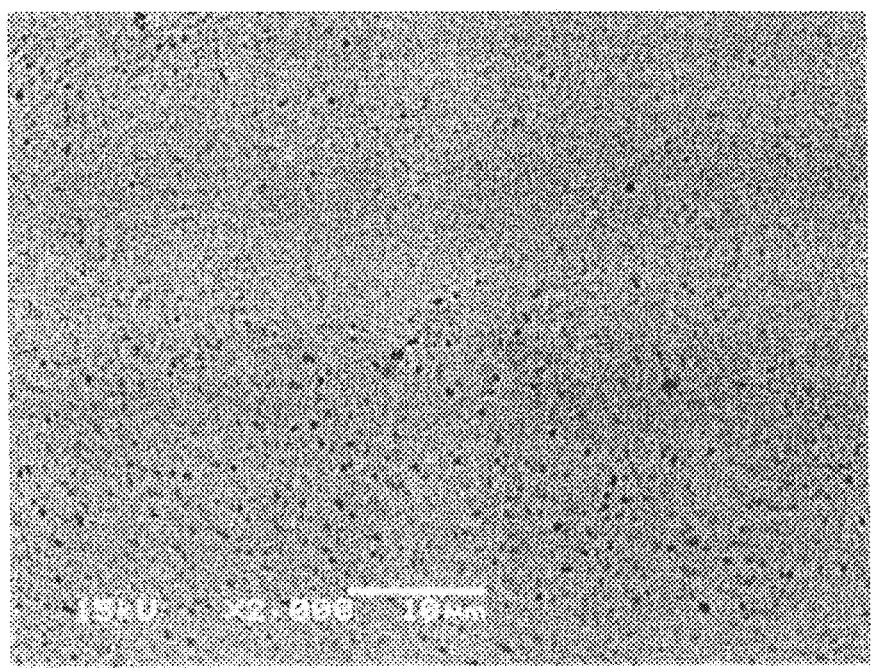
FIG. 1 shows the cross-sectional microstructure of the solder of Example 2, which corresponds to a good grade in a structural refinement test.

Nanoparticles used in the present invention may be nanoparticles made entirely of Ag, Au, or Cu, or they may be nanoparticles of other materials such as SiC, SiN TiN, C, Ni, Co, $Al_2O_3$, $ZrO_2$, $TiO_2$, $CeO_2$, CaO, $Mn_3O_4$, MgO, and ITO ($In_2O_3$ +$SnO_2$), which have been successfully formed into nanoparticles, plated with Ag, Au, or Cu. Even with the latter type of nanoparticles made of other materials which are plated with Ag, Au, or Cu, the same effect can be achieved since the Ag, Au, or Cu on the surface of the minute powder reacts with Zn to form nuclei for Zn to be crystallized.

Nanoparticles used in the present invention may be nanoparticles containing a single metal selected from Ag, Au, and Cu, or they may be nanoparticles containing two or more of Ag, Au, and Cu.

Nanoparticles used in the present invention can provide the same effect as long as they have a particle diameter of the nanometer order. However, at present, it is difficult to manufacture nanoparticles with a diameter of less than 5 nm. On the other hand, with powder having a particle diameter exceeding 1,000 nm, since it is necessary to refine the size of the crystallizate to at most several hundred nanometers in order to increase the strength of the solder alloy, nanoparticles with a diameter of at most 300 nm are preferable as nuclei for a crystallizate. A portion of the nanoparticles dissolves in the molten solder during melting of the solder, so it is thought that the diameter of the nuclei at the initial stage of Zn crystallization is still smaller than the diameter of the nanoparticles which are added.

In the present invention, the nanoparticles having a particle diameter of 5-300 nm and containing at least one of Ag, Au, and Cu preferably comprise from 0.01 mass percent to 2.0mass percent of the total amount of a solder paste obtained by mixing a dispersion in an alcoholic solvent which contains the nanoparticles with a flux and a solder powder. If the content of the nanoparticles is less than 0.01 mass percent, there is too little formation of intermetallic compounds with an Sn—Zn based lead-free solder powder which serves as crystallization nuclei, and the effect of refining the solder structure is not obtained. On the other hand, if the nanoparticles are added in excess of 2.0 mass percent, the nanoparticles which have reacted with the Sn—Zn based lead-free solder cause the liquidus temperature of the solder to significantly increase, and the fusing properties of the solder at a relatively low soldering temperatures are worsened. As a result, the advantage of an Sn-Zn based lead-free solder alloy that it can be used with parts which do not have good heat resistance can no longer be obtained.

In the present invention, nanoparticles are used to form crystallization nuclei of an intermetallic compound of Zn with Ag, Au, or Cu. If Ag or the like is added by dissolving it in an Sn—Zn based lead-free solder as disclosed in Patent Document 2, the added Ag is completely melted, and the formation of an intermetallic compound and crystallization nuclei of Zn in which Ag, Au, or Cu is dissolved in the form of solid solution occurs according to the probability theory. Therefore, such a method cannot refine the resulting crystallizate. In the present invention, the phenomenon that a large amount of nuclei of Zn are uniformly dispersed in the liquid phase of molten solder so as not to impede the fluid properties of the liquid is found.

From another aspect, the present invention is a method of refining the structure of solder formed after soldering by performing soldering using a solder paste formed by mixing a dispersion in an alcoholic solvent which contains nanoparticles having a particle diameter of 5-300 nm and containing at least one of Ag, Au, and Cu with a flux and a solder powder.

Nanoparticles containing at least one of Ag, Au, and Cu and measuring 5-300 nm are readily oxidized by exposure to air due to their minute particle diameter. Therefore, they are stored by a method capable of preventing them from contacting air such as enclosing the nanoparticles in an inert gas or storing them in oil. However, even if nanoparticles are enclosed in an inert gas, they end up contacting air at the time of manufacturing a solder paste. As a result, they are oxidized, and their reactivity with an Sn—Zn based lead-free solder powder is thus weakened, leading to the formation of a large number of solder balls. In a method in which the nanoparticles are stored in oil, if they are mixed with solder powder and flux together with the oil in which they are stored to manufacture a solder paste, since the oil itself has no solderability, the resulting solder paste has deteriorated solderability, resulting in the formation of a large number of solder balls.

It is conceivable to mix the nanoparticles with rosin or a flux and store them in this state. However, rosin and a flux can react with the nanoparticles, so this method is not suitable for storage of the nanoparticles.

Therefore, in the present invention, nanoparticles containing at least one of Ag, Au, and Cu and having a particle diameter of 5-300 nm are dispersed in an alcoholic solvent and they are mixed with solder powder and a flux together with the alcoholic solvent to prepare a solder paste.

An alcoholic solvent is an alcohol which contains a hydroxyl group and is liquid at room temperature. The hydroxyl group or groups contained in an alcoholic solvent promote the action of an activator in flux that it decomposes and dissociates into ions and removes oxides when heated at the time of reflow. Suitable alcoholic solvents which can be used in the present invention include aliphatic alcohols such as methanol, ethanol, isopropanol, ethylene glycol, and diethylene glycol; aromatic alcohols such as cresol; terpene alcohols such as α-terpineol; and glycol ethers such as ethylene glycol monobutyl ether, diethylene glycol monohexyl ether, diethylene glycol mono-2-ethylhexyl ether, and ethylene glycol monophenyl ether. In the presence of moisture, the nanoparticles tend to be oxidized on their surface more easily than do usual-size particles of the micrometer order. For this reason, an alcoholic solvent used in the present invention is preferably one which does not readily absorb moisture and which is used in solder paste. Therefore, more preferred alcoholic solvents for use in the present invention are terpene alcohols such as α-terpineol, and glycol ethers such as ethylene glycol monobutyl ether, diethylene glycol monohexyl ether, diethylene glycol mono-2-ethylhexyl ether, and ethylene glycol monophenyl ether.

EXAMPLE I

A flux having the following composition was used in examples of the present invention and in comparative examples:

42 mass % of modified rosin,
6 mass % of isocyanuric acid tris(2,3-dibromopropyl) ether,
3 mass % of 2,3-hydroxybenzoic acid,
8 mass % of diphenylguanidine,
7 mass % of hydrogenated castor oil, and
34 mass % of diethylene glycol monohexyl ether.

Using the above-described flux, solder pastes were prepared and their properties were compared. Each solder pastes was prepared by charging a stirred vessel with a solder powder, a flux, and a dispersion containing nanoparticles followed by mixing. The compositions of the solder pastes of the examples and the comparative examples were as follows.

Example (1)

88.5 mass % of Sn-9Zn solder powder (20-40 μm),
0.2 mass % (0.08 mass % as Cu) of a 40% dispersion of 300 nm Cu particles in diethylene glycol monohexyl ether, and
11.3 mass % of flux.

Example (2)

88.5 mass % of Sn-9Zn solder powder (20-40 μm),
0.2 mass % (0.08 mass % as Cu) of a 40% dispersion of 10 nm Cu particles in diethylene glycol monohexyl ether, and
11.3 mass % of flux.

Example (3)

88.5 mass % of Sn-9Zn solder powder (20-40 μm),
0.025 mass % (0.01 mass % as Ag) of a 40% dispersion of 100 nm Ag particles in diethylene glycol monohexyl ether, and
11.475 mass % of flux.

Example (4)

84.5 mass % of Sn-9Zn solder powder (20-40 μm),
5.0 mass % (2.0 mass % as Ag) of a 40% dispersion of 100 nm Ag particles in diethylene glycol monohexyl ether, and
10.5 mass % of flux.

Example (5)

88.5 mass % of Sn-9Zn solder powder (20-40 μm),
0.2 mass % (0.08 mass % as Au) of a 40% dispersion of 100 nm Au particles in diethylene glycol monohexyl ether, and
11.3 mass % of flux.

Example (6)

88.3 mass % of Sn-9Zn solder powder (20-40 μm),
0.4 mass % (0.08 mass % as Ag and 0.08 mass % as Cu) of a 40% dispersion of a mixture of 100 nm Ag particles and 100 nm Au particles in diethylene glycol monohexyl ether, and
11.3 mass % of flux.

Comparative Example (1)

Patent Document 3

88.5 mass % of Sn-9Zn solder powder (20-40 μm),
0.2 mass % (0.08 mass % as Ni) of a 40% dispersion of 100 nm Ni particles in diethylene glycol monohexyl ether, and
11.3 mass % of flux.

Comparative Example (2)

82.5 mass % of Sn-9Zn solder powder (20-40 μm),
7.5 mass % (3.0 mass % as Ag) of a 40% dispersion of 100 nm Ag particles in diethylene glycol monohexyl ether, and
10.0 mass % of flux.

Comparative Example (3)

88.5 mass % of Sn-9Zn solder powder (20-40 μm),
0.2 mass % (0.08 mass % as Ag) of a 40% dispersion of 1500 nm Ag particles in diethylene glycol monohexyl ether, and
11.3 mass % of flux.

1-2. Test of Bonding Strength of Chip Parts

Using a joint bonding tester STR-1000 manufactured by Rheska Corporation, Japan with a shear tool having a width of 3 mm and a depth of 2 mm, the bonding strength (shear strength) of the 3216-size chip part on each test substrate was measured at a testing rate of 5 mm per minute (a rate recommended by the Japan Electronics and Information Technology Industries Association (JEITA): 0.5-9 mm per minute). 8-15 data points were taken for each sample, and the averages thereof were compared. For practical use, a bonding strength of at least 75 N is necessary.

The results of the examples and comparative examples are shown in Table I.

TABLE I

|  |  | Nanoparticles | | | Test results | | |
| --- | --- | --- | --- | --- | --- | --- | --- |
|  |  | Metal | Content (%) | Particle diameter (nm) | Refinement of structure | Bonding strength | Comments |
| Example | (1) | Cu | 0.08 | 300 | ○ | 78 N |  |
|  | (2) | Cu | 0.08 | 10 | ○ | 83 N |  |
|  | (3) | Ag | 0.01 | 100 | ○ | 80 N |  |
|  | (4) | Ag | 2.00 | 100 | ○ | 82 N |  |
|  | (5) | Au | 0.08 | 100 | ○ | 79 N |  |
|  | (6) | Ag, Cu | 0.08 | 100 | ○ | 83 N |  |
| Comparative Example | (1) | Ni | 0.08 | 100 | X | 70 N | Pat. Doc. 3 |
|  | (2) | Ag | 3 | 100 | ○ | 60 N |  |
|  | (3) | Ag | 0.08 | 1500 | X | 72 N |  |
|  | (4) | — | — | — | X | 72 N | Pat. Doc. 2 |
|  | (5) | Cu | 8.00 | 20-40 (μm) | Solder did not melt | | Pat. Doc. 1 |

Comparative Example (4)

Patent Document 2

88.5 mass % of Sn-3Bi-0.08Ag-8Zn solder powder (20-40 μm), and
11.5 mass % of flux.

Comparative Example (5)

Patent Document 1

80.0 mass % of Sn-9Zn solder powder (20-40 μm),
8.0 mass % of pure Cu metal powder (20-40 μm), and
12.0 mass % of flux.

1. Testing Methods

The solder paste of each example and the comparative example was printed on a Cu pattern of a glass/epoxy substrate measuring 140×120×1 mm for use in mounting a 3216-size chip resistor. The printed substrate was then subjected to reflow heating with a preheating temperature of 150° C. for 120 seconds and a main heating temperature of at least 205° C. for 35 seconds using a reflow furnace SNR725 manufactured by Senju Metal Industry, Japan to prepare a test substrate.

1-1. Refinement of Solder Structure

After being allowed to cool for one day, the test substrates of the examples and the comparative examples were observed with an electron microscope at a magnification of 1000× and refinement of the solder structure was compared.

Samples for which refinement of the structure was observed were evaluated as CIRCLE (○) (good) and samples for which refinement of the structure was not observed were evaluated as X (poor).

Figure 2:
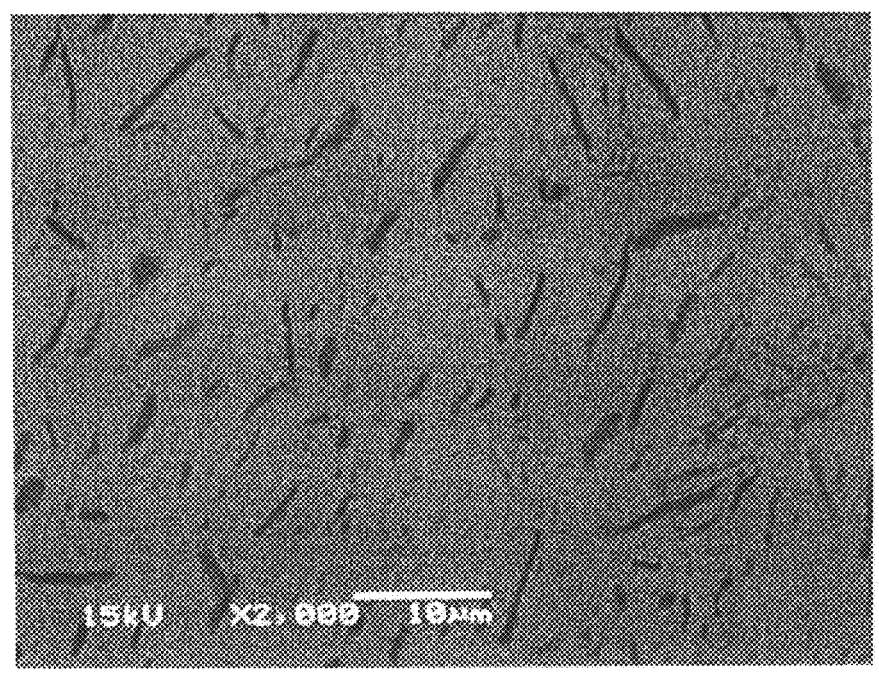
FIG. 2 shows the cross-sectional microstructure of the solder of Comparative Example 4, which corresponds to a poor grade in a structural refinement test.

Typical examples of changes in solder structure after a temperature cycle are shown in FIG. 1 and FIG. 2.

FIG. 1 shows the solder structure of Example (2) in which Ag nanoparticles were added to a solder paste. The solder structure was refined, and the result corresponds to a CIRCLE (○) in the refinement test of solder structure.

FIG. 2 shows the solder structure of Comparative Example 4 in which Ag was initially added to the solder alloy as an alloying element. Structural refinement did not occur, and the result corresponds to an X in the structural refinement test.

EXAMPLE II

Nanoparticles which were stored by the below-described methods were mixed with a solder powder and a flux to prepare solder pastes. The solder pastes were tested by a solder ball test, and the solder balls formed at the time of heating were compared.

The flux used in this test was that used in Example I, and the compositions of the solder pastes were such that the Cu content of each of the examples and comparative examples was 0.08 mass %.

Example (1)

88.5 mass % of Sn-3Bi-8Zn solder powder (20-40 μm),
0.2 mass % (0.08 mass % as Cu) of a 40% dispersion of 20 nm Cu particles in diethylene glycol monohexyl ether, and
11.3 mass % of flux.

Example (2)

88.5 mass % of Sn-3Bi-8Zn solder powder (20-40 μm),
0.2 mass % (0.08 mass % as Cu) of a 40% dispersion of 20 nm Cu particles in α-terpineol, and
11.3 mass % of flux.

Comparative Example (1)

Cu Particles Stored in Nitrogen was Directly Mixed with Solder Powder 88.5 mass % of Sn-3Bi-8Zn solder powder (20-40 μm),
0.08 mass % of powder of 20 nm Cu particles (stored in nitrogen), and
11.42 mass % of flux.

Comparative Example (2)

88.5 mass % of Sn-3Bi-8Zn solder powder (20-40 μm),
0.2 mass % (0.08 mass % as Cu) of a 40% dispersion of 20 nm Cu particles in a thermal oil, and
11.3 mass % of flux.

The results of the above-described examples and comparative examples are shown in Table II.

TABLE II

| | Solder ball test (category) | Comments |
|---|---|---|
| Example (1) | 2 | |
| Example (2) | 2 | |
| Comparative Example (1) | 4 | Stored in nitrogen |
| Comparative Example (2) | 3 | Stored in oil |

1. Solder Ball Test

Test method (in accordance with Appendix 11 of JIS Z 3284)

The solder paste of each example and comparative example was printed on an alumina substrate, and within one hour after printing, the alumina substrate was placed atop a solder bath set to 250° C. to melt the solder paste.

The external appearance of solidified solder was observed with a magnifying is glass at a magnification of from 10× to 20×, while the diameter and the number of solder balls were measured by observation with a magnifying glass at a magnification of 50×. Evaluation was made by the degree of aggregation of solder particles as set forth in Table 1 and FIG. 1 of Appendix 11.

2. Test Results

In Example I, the solidified solder formed from the solder paste of each example exhibited refinement of solder structure, and there was no occurrence of cracking after temperature cycles. However, the solidified solder formed from the solder paste of each comparative example exhibited cracking when subjected to temperature cycles. In particular, in Comparative Example (5) of Example I which was based on Patent Document 1, the solder after reflow was in an unmelted state, and Cu particles remained as they were without dissolving in molten solder.

In Example II, the solder paste of each example which contained nanoparticles dispersed in an alcoholic solvent had little occurrence of solder balls, but there was much occurrence of solder balls for the solder paste of comparative examples in which nanoparticles were stored in nitrogen or dispersed in oil.

INDUSTRIAL APPLICABILITY

A solder paste according to the present invention formed by mixing a dispersion in an alcoholic solvent containing nanoparticles which have a particle diameter of 5-300 nm and contain at least one of Ag, Au, and Cu with a flux and solder powder has the effect of refining the solder structure for not only Sn—Zn based solder alloys but also Sn—Ag based solder alloys, Sn—Cu based solder alloys, and Sn—Ag—Cu solder alloys by suitably selecting the type of nanoparticles which can serve as crystallization nuclei of the appropriate intermetallic compound. Therefore, a solder paste formed by mixing a dispersion in an alcoholic solvent containing at least one type of nanoparticles which have a particle diameter of 5-300 nm and which can serve as nuclei for the appropriate intermetallic compound with solder powder of an Sn—Ag based solder alloy, an Sn—Cu based solder alloy, or an Sn—Ag—Cu based solder alloy and flux can provide a solder alloy joint with a high bonding strength.

The invention claimed is:

1. A solder paste consisting of a Sn—Zn based lead-free solder alloy powder having a particle diameter of 20-40 μm,
0.01-2.0 mass percent of particles disposed on the surface of the solder alloy powder and having a particle diameter of 5-300 nm and each consisting of elemental Ag, Au, or Cu, and
a flux mixed with the solder alloy powder and the particles,
wherein the solder paste is prepared by mixing a dispersion of the particles in an alcoholic solvent, which solvent is incorporated into the flux by the mixing, with the solder alloy powder and the components of the flux prior to incorporation of the alcoholic solvent contained in the dispersion into the flux.

2. A solder paste as claimed in claim 1 wherein the solder alloy powder contains at least one of Ag and Cu.

3. A solder paste as claimed in claim 1 wherein the solder alloy powder and the particles contain a chemical element in common.

4. A solder paste consisting of a Sn—Zn based lead-free solder alloy powder having a particle diameter of 20-40 μm,
0.01-2.0 mass percent of particles having a particle diameter of 5-300 nm, and
a flux mixed with the solder alloy powder and the particles,
wherein the particles have a core of a material other than elemental Ag, Au, or Cu plated with Ag, Au, or Cu, and the solder paste is prepared by mixing a dispersion of the particles in an alcoholic solvent, which solvent is incorporated into the flux by the mixing, with the solder alloy powder and the components of the flux prior to incorporation of the alcoholic solvent contained in the dispersion into the flux.

5. A soldering method comprising soldering using a solder paste as claimed in claim 1 to refine the structure of solder after soldering.

6. A method of preparing a solder paste comprising mixing 0.01-2.0 mass percent with respect to the total mass of the paste of particles each consisting of elemental Ag, Au, or Cu and having a particle diameter of 5-300 nm dispersed in an alcoholic solvent with a Sn—Zn based lead-free solder alloy powder having a particle diameter of 20-40 μm and a flux to incorporate the alcoholic solvent into the flux and obtain a solder paste consisting of the solder alloy powder, the particles consisting of Ag, Au, or Cu disposed on the surface of the solder alloy powder, and the flux.

* * * * *